US012550432B2

(12) United States Patent
Kim et al.

(10) Patent No.: US 12,550,432 B2
(45) Date of Patent: Feb. 10, 2026

(54) ORGANIC LIGHT EMITTING DIODE DISPLAY APPARATUS

(71) Applicant: LG Display Co., Ltd., Seoul (KR)

(72) Inventors: Jin-Sung Kim, Paju-si (KR); A-Ram Kim, Paju-si (KR); Bok-Young Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 573 days.

(21) Appl. No.: 17/994,785

(22) Filed: Nov. 28, 2022

(65) Prior Publication Data

US 2023/0180543 A1    Jun. 8, 2023

(30) Foreign Application Priority Data

Dec. 6, 2021    (KR) .................. 10-2021-0172889

(51) Int. Cl.
*H01L 27/32* (2006.01)
*H01L 51/56* (2006.01)
(Continued)

(52) U.S. Cl.
CPC ....... *H10D 86/425* (2025.01); *H10D 30/6731* (2025.01); *H10D 30/6745* (2025.01);
(Continued)

(58) Field of Classification Search
CPC ........... H10D 30/6745; H10D 30/6755; H10D 30/6756; H10D 62/57
See application file for complete search history.

(56) References Cited

U.S. PATENT DOCUMENTS 6,514,800 B2    2/2003   Saigo
7,417,246 B2    8/2008   Shin et al.
(Continued)

FOREIGN PATENT DOCUMENTS

JP          2005294859 A  * 10/2005   ............. H01L 21/20
KR    10-2002-0020195 A    3/2002
(Continued)

OTHER PUBLICATIONS

Machine translation, Lee, Korean Pat. Pub. No. KR-101201316-B1, translation date: Jun. 7, 2025, Espacenet, all pages. (Year: 2025).*

(Continued)

*Primary Examiner* — Victoria K. Hall
(74) *Attorney, Agent, or Firm* — Fenwick & West LLP

(57) ABSTRACT

An organic light emitting display apparatus is disclosed that comprises a substrate including a first portion and a second portion; a first thin film transistor having a first polycrystalline semiconductor pattern, the first thin film transistor on the first portion of the substrate; a second thin film transistor having a first oxide semiconductor pattern, the second thin film transistor on the second portion of the substrate; and an organic light emitting device configured to emit light, the organic light emitting device connected to the second thin film transistor; wherein the first polycrystalline semiconductor pattern includes a surface that is planarized and the first oxide semiconductor pattern includes a surface that includes a plurality of protrusions.

27 Claims, 7 Drawing Sheets

(51) Int. Cl.

|  |  |
|---|---|
| *H10D 30/67* | (2025.01) |
| *H10D 62/57* | (2025.01) |
| *H10D 86/40* | (2025.01) |
| *H10D 86/60* | (2025.01) |
| *H10K 59/121* | (2023.01) |
| *H10K 59/123* | (2023.01) |
| *H10K 59/126* | (2023.01) |
| *H10K 71/00* | (2023.01) |
| *H10K 59/12* | (2023.01) |

(52) U.S. Cl.
CPC ......... *H10D 30/6755* (2025.01); *H10D 62/57* (2025.01); *H10D 86/423* (2025.01); *H10D 86/60* (2025.01); *H10K 59/1213* (2023.02); *H10K 59/123* (2023.02); *H10K 59/126* (2023.02); *H10K 71/00* (2023.02); *H10D 30/6723* (2025.01); *H10K 59/1201* (2023.02)

(56) References Cited

U.S. PATENT DOCUMENTS

| 8,987,728 | B2* | 3/2015 | Honda ............... H01L 21/47573 |
|---|---|---|---|
|  |  |  | 257/43 |
| 9,761,733 | B2* | 9/2017 | Yamazaki ......... H01L 21/02554 |
| 9,859,117 | B2* | 1/2018 | Yamazaki ............ C23C 14/3414 |
| 10,209,594 | B2* | 2/2019 | Feng .................... G02F 1/13439 |
| 11,282,964 | B2* | 3/2022 | Yamazaki ............ H10B 12/315 |
| 11,489,076 | B2* | 11/2022 | Yamazaki ......... H10D 30/6734 |
| 2002/0031872 | A1 | 3/2002 | Saigo |
| 2005/0077575 | A1 | 4/2005 | Shin et al. |
| 2005/0233575 | A1* | 10/2005 | Abe .................... H10D 30/0321 |
|  |  |  | 257/E29.151 |
| 2008/0035933 | A1* | 2/2008 | Nagata ................... H10D 86/60 |
|  |  |  | 257/E29.151 |
| 2008/0083950 | A1* | 4/2008 | Pan ...................... H10D 62/121 |
|  |  |  | 438/151 |
| 2008/0142808 | A1 | 6/2008 | Lee |
| 2012/0241734 | A1* | 9/2012 | Honda ............... H01L 21/47573 |
|  |  |  | 257/43 |
| 2017/0307921 | A1* | 10/2017 | Feng ...................... G02F 1/1343 |
| 2019/0280021 | A1* | 9/2019 | Lee ..................... H10D 30/6731 |
| 2021/0210635 | A1* | 7/2021 | Yamazaki ............ H10D 62/118 |
| 2021/0376084 | A1* | 12/2021 | van Dal ............... H10D 30/026 |
| 2021/0408061 | A1* | 12/2021 | Shin ....................... G09G 3/3233 |
| 2023/0143126 | A1* | 5/2023 | Yeon ....................... H10K 71/00 |
|  |  |  | 257/40 |

FOREIGN PATENT DOCUMENTS

| KR | 20020089960 A | * | 11/2002 | ....... G02F 1/134309 |
|---|---|---|---|---|
| KR | 10-2008-0056956 A |  | 6/2008 |  |
| KR | 10-1001471 B1 |  | 12/2010 |  |
| KR | 10-2012-0109347 A |  | 10/2012 |  |
| KR | 101201316 B1 | * | 11/2012 | ......... H10D 30/6758 |
| KR | 10-20070114880 A | * | 4/2013 | ......... H10D 30/0314 |
| KR | 1020170059502 A | * | 5/2017 | ......... H01L 21/3215 |

OTHER PUBLICATIONS

Machine translation, Yamazaki, Japanese Pat. Pub. No. JP-2005294859-A, translation date: Jun. 7, 2025, Espacenet, all pages. (Year: 2025).*

Machine translation, Oh, Korean Pat. Pub. No. KR20070114880A1, translation date: Jun. 7, 2025, Espacenet, all pages. (Year: 2025).*

Machine translation, Cho, Korean Pat. Pub. No. KR100425159B1, translation date: Jun. 7, 2025, Espacenet, all pages. (Year: 2025).*

Machine translation, Choo, Korean Pat. Pub. No. KR20170059502A, translation date: Jun. 7, 2025, Espacenet, all pages. (Year: 2025).*

S. Masuda et al., Transparent thin film transistors using ZnO as an active channel layer and their electrical properties, Feb. 1, 2003, J. Applied Physics, vol. 93, No. 3, pp. 1624-1630. (Year: 2003).*

Korean Intellectual Property Office, Office Action, Korean Patent Application No. 10-2021-0172889, Jun. 20, 2025, eight pages.

* cited by examiner

ORGANIC LIGHT EMITTING DIODE DISPLAY APPARATUS

CROSS-REFERENCE TO RELATED APPLICATION

This application claims priority to and the benefit of Republic of Korea Patent Application No. 10-2021-0172889, filed on Dec. 6, 2021, which is hereby incorporated by reference in its entirety.

BACKGROUND

1. Technical Field

The present disclosure relates to an organic light emitting display apparatus, and in particular to the organic light emitting display apparatus capable of expressing a wide range of grayscale expression and enabling fast on-off operation by controlling an S-factor of a specific thin film transistor among a plurality of thin film transistors.

2. Discussion of the Related Art

As multimedia develops, the importance of flat panel display is increasing. As such a flat panel display device, a flat panel display device such as a liquid crystal display device, a plasma display device, and an organic light emitting display device has been commercialized. Among these flat panel display devices, the organic light emitting display device is currently widely used in because of a high response speed, high luminance and good viewing angle.

In the organic light emitting display device, a plurality of pixels are arranged in a matrix shape, and an organic light emitting device and a thin film transistor are disposed in each pixel. The thin film transistor includes a plurality of thin film transistors such as a driving TFT for supplying a driving current to operate the organic light emitting diode and a switching thin film transistor for supplying a gate signal to the driving thin film transistor.

A gate driving circuit unit for applying a gate signal to a pixel may be disposed in a non-display area of the organic light emitting display apparatus. The gate driving circuit unit may be configured in a CMOS type having a pair of an n-type thin film transistor and a p-type thin film transistor.

Since a plurality of thin film transistors are disposed in a pixel portion and a gate driving circuit unit in the pixel, specifically a sub-pixel, perform different functions, electrical characteristics according to different functions must also be different from each other. In order to vary the electrical characteristics of the plurality of thin film transistors disposed in the pixel, the plurality of thin film transistors having different structures must be formed in the pixel or the plurality of thin film transistors made of different semiconductor materials must be formed in the pixel. However, in this case, there is a problem in that the manufacturing process is complicated and the manufacturing cost is increased.

SUMMARY

Accordingly, embodiments of the present disclosure are directed to a display device that substantially obviates one or more of the problems due to limitations and disadvantages of the related art.

An object of the present disclosure is to provide an organic light emitting display apparatus in which a plurality of thin film transistors are disposed in a gate driving circuit unit has uniform operation characteristics, rich grayscale expression characteristics in a pixel, and fast switching characteristics.

In order to achieve the object, an organic light emitting display apparatus according to the present disclosure may comprise: a substrate including a first portion and a second portion; a first thin film transistor having a first polycrystalline semiconductor pattern, the first thin film transistor on the first portion of the substrate; a second thin film transistor having a first oxide semiconductor pattern, the second thin film transistor on the second portion of the substrate; and an organic light emitting device configured to emit light, the organic light emitting device connected to the second thin film transistor; wherein the first polycrystalline semiconductor pattern includes a surface that is planarized and the first oxide semiconductor pattern includes a surface that includes a plurality of protrusions.

In one embodiment, a method of fabricating an organic light emitting display apparatus, the method comprises: providing a substrate including a first portion and a second portion that is spaced apart from the first portion; forming a lower buffer layer on the substrate; forming a polycrystalline semiconductor layer on the lower buffer layer; planarizing an upper surface of a first portion of the polycrystalline semiconductor layer that is on the first portion without planarizing an upper surface of a second portion of the polycrystalline semiconductor layer that is on the second portion of the substrate; forming a first polycrystalline semiconductor pattern in the first portion and a first plurality of protrusions at the upper surface of the lower buffer layer in the second portion by etching the polycrystalline semiconductor layer; and forming a first oxide semiconductor pattern over the first plurality of protrusions, the first oxide semiconductor pattern including a second plurality of protrusions that overlap the first plurality of protrusions.

In one embodiment, an organic light emitting display apparatus, comprises: a substrate including a display area and a non-display area outside of the display area; and a thin film transistor at the display area and including an active layer having an oxide semiconductor pattern, the oxide semiconductor pattern having an upper surface including a first plurality of protrusions, and an insulating layer between the oxide semiconductor layer and the substrate, the insulating layer including a second plurality of protrusions on a surface of the insulating layer and the second plurality of protrusions overlapping the first plurality of protrusions.

In one embodiment, a display device comprises: a substrate including a display area and a non-display area; a first transistor in the display area, the first transistor including a first semiconductor layer with a first plurality of protrusions on at least a portion of a surface of the first semiconductor layer; a second transistor in the non-display area, the second transistor including a second semiconductor layer that is made of a different material than the first semiconductor layer and a surface of the second semiconductor layer is planarized; and a light emitting device in the display area, the light emitting device electrically connected to the first transistor.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
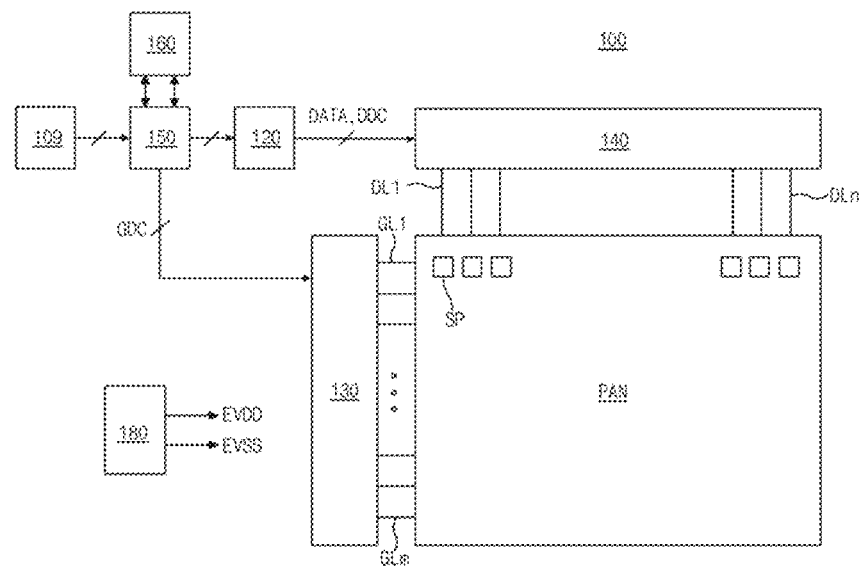
FIG. 1 is a schematic block diagram of an organic light emitting display device according to one embodiment of the present disclosure.

Advantages and features of the present disclosure and methods for achieving them will be made clear from embodiments described in detail below with reference to the accompanying drawings. The present disclosure may, however, be implemented in many different forms and should not be construed as being limited to the embodiments set forth herein, and the embodiments are provided such that this disclosure will be thorough and complete and will fully convey the scope of the present disclosure to those skilled in the art to which the present disclosure pertains, and the present disclosure is defined only by the scope of the appended claims.

Shapes, sizes, ratios, angles, numbers, and the like disclosed in the drawings for describing the embodiments of the present disclosure are illustrative, and thus the present disclosure is not limited to the illustrated matters. The same reference numerals refer to the same components throughout this disclosure. Further, in the following description of the present disclosure, when a detailed description of a known related art is determined to unnecessarily obscure the gist of the present disclosure, the detailed description thereof will be omitted herein. When terms such as "including," "having," "comprising," and the like mentioned in this disclosure are used, other parts may be added unless the term "only" is used herein. When a component is expressed as being singular, being plural is included unless otherwise specified.

In analyzing a component, an error range is interpreted as being included even when there is no explicit description.

In describing a positional relationship, for example, when a positional relationship of two parts is described as being "on," "above," "below," "next to," or the like, unless "immediately" or "directly" is not used, one or more other parts may be located between the two parts.

In describing a temporal relationship, for example, when a temporal predecessor relationship is described as being "after," "subsequent," "next to," "prior to," or the like, unless "immediately" or "directly" is not used, cases that are not continuous may also be included.

Although the terms first, second, and the like are used to describe various components, these components are not substantially limited by these terms. These terms are used only to distinguish one component from another component. Therefore, a first component described below may substantially be a second component within the technical spirit of the present disclosure.

In describing components of the specification, the terms first, second, A, B, (a), (b), and the like can be used. These terms are intended to distinguish one component from other components, but the nature, sequence, order, or number of the components is not limited by those terms. When components are disclosed as being "connected," "coupled," or "in contact" with other components, the components can be directly connected or in contact with the other components, but it should be understood that other component(s) could be "interposed" between the components and the other components or could be "connected," "coupled," or "contacted" therebetween.

Hereinafter, the present disclosure will be described in detail accompanying drawings.

Figure 2A:
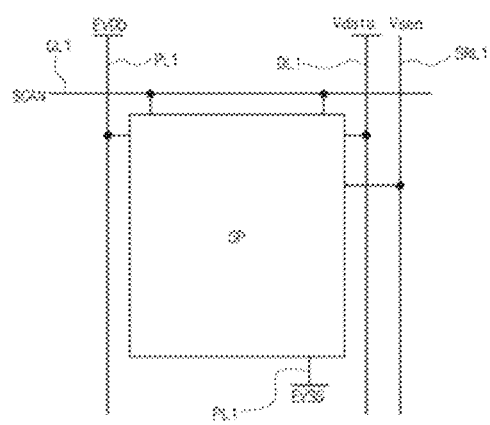
FIG. 2A is the schematic block diagram of a sub-pixel of the organic light emitting display device according to one embodiment of the present disclosure.

FIG. 1 is the schematic block diagram and FIG. 2A is the schematic block diagram of the sub-pixel of the organic light emitting display device according to one embodiment of the present disclosure.

As shown in FIG. 1, the organic light emitting display apparatus 100 includes a display panel PAN. In the organic light emitting display apparatus 100, the display panel PAN, an image processing unit 110, a deterioration compensating unit 150, a memory 160, a timing controlling unit 120, a data driving unit 140, a power supplying unit 180, and a gate driving unit 130 are disposed.

The image processing unit 110 (e.g., a circuit) outputs an image data supplied from outside and a driving signal for driving various devices. For example, the driving signal from the image processing unit 110 can include a data enable signal, a vertical synchronizing signal, a horizontal synchronizing signal, and a clock signal.

The deterioration compensating unit 150 (e.g., a circuit) calculates a deterioration compensation gain value of the sub-pixel SP of the display panel based on a sensing voltage Vsen supplied from the data driving unit 140. Further, the deterioration compensating unit 150 calculates a dimming weight value based on the calculated deterioration compensation gain value and then uses the calculated deterioration compensation gain value and dimming weight value to modulate the input image data Idata of each sub-pixel (SP)

of the current frame. Thereafter, the deterioration compensating unit 150 supplies the modulated image data Mdata to the timing controlling unit 120.

The modulated image data Mdata modulated by the deterioration compensating unit 150 and a driving signal are supplied to the timing controlling unit 120. The timing controlling unit 120 or timing controller (e.g., a circuit) writes and outputs gate timing controlling signal GDC for controlling the driving timing of the gate driving unit 130 and data timing controlling signal DDC for controlling the driving timing of the data driving unit 140 based on the driving signal from the image processing unit 110.

In addition, the timing controlling unit 120 controls the operation timings of the gate driving unit 130 and the data driving 140 to obtain at least one sensing voltage Vsen from each sub-pixel SP and then supplies it to the deterioration compensating unit 150.

The gate driving unit 130 or gate driver (e.g., a circuit) outputs the scan signal to the display panel PAN in response to the gate timing control signal GDC supplied from the timing controlling unit 120. The gate driving unit 130 outputs the scan signal through a plurality of gate lines GL1 to GLm. In this case, the gate driving unit 130 may be formed in the form of an integrated circuit (IC), but is not limited thereto. In particular, the gate driving unit 130 may have a GIP (Gate In Panel) structure formed by directly depositing thin film transistors on a substrate inside the organic light emitting display apparatus 100. The GIP may include a plurality of circuits such as a shift register and a level shifter.

The data driving unit 140 or data driver (e.g., a circuit) outputs the data voltage to the display panel PAN in response to the data timing control signal DDC input from the timing controlling unit 120. The data driving unit 140 samples and latches the digital data signal DATA supplied from the timing controlling unit 120 to convert it into the analog data voltage based on the gamma voltage. The data driving unit 140 outputs the data voltage through the plurality of data lines DL1 to DLn.

Further, the sensing voltage Vsen input from the display panel PAN is supplied to the deterioration compensating unit 150 through the sensing voltage readout line by the data driving unit 140.

In this case, the data driving unit 140 may be mounted on the upper surface of the display panel PAN in the form of an integrated circuit (IC) or may be directly formed on the display panel PAN, but is limited thereto.

The display panel PAN displays the image based on the data voltage from the data driving unit 140, the scan signal from the gage driving unit 130, and the power from the power supplying unit 180.

The display panel PAN includes a plurality of sub-pixels SP to display the image. The sub-pixel SP can include a red sub-pixel, a green sub-pixel, and a blue sub-pixel. Further, the sub-pixel SP can include a white sub-pixel, the red sub-pixel, the green sub-pixel, and the blue sub-pixel. The white sub-pixel, the red sub-pixel, the green sub-pixel, and the blue sub-pixel may be formed in the same area or may be formed in different areas.

A lookup table for the deterioration compensating gain and the deterioration compensating timing of the organic light emitting device of the sub-pixel SP are stored in the memory 160. In this case, the time of compensating for deterioration of the organic light emitting display apparatus may be the driving number or driving time of the organic light emitting display apparatus.

As shown in FIG. 2A, one sub-pixel SP may be connected to the gate line GL1, the data line DL1, the sensing voltage readout line SRL1, and the power line PL1. The number of transistors and capacitors and the driving method of the sub-pixel SP are determined according to the circuit configuration.

The power supplying unit 180 (e.g., a circuit) outputs a high potential driving voltage EVDD and a low potential driving voltage EVSS that is less than the high potential driving voltage EVDD etc. to supply these to the display panel PAN. The high potential driving voltage EVDD and the low potential driving voltage EVSS is supplied to the display panel PAN through the power line. In this time, the voltages from the power supplying unit 180 are applied to the data driving unit 140 or the gate driving unit 130 to drive thereto.

Figure 2B:
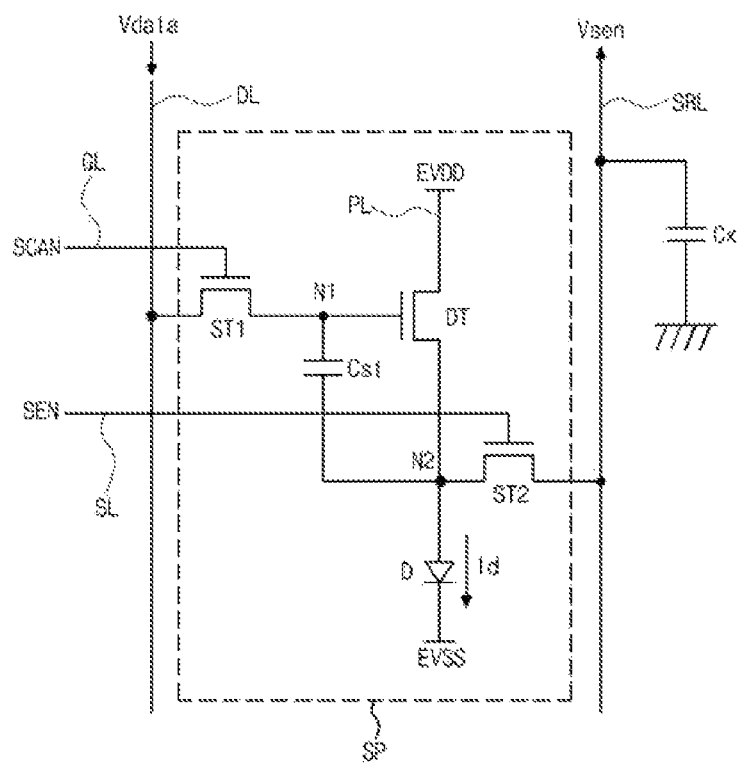
FIG. 2B is a circuit diagram of the sub-pixel of the organic light emitting display device according to one embodiment of the present disclosure.

FIG. 2B is the circuit diagram illustrating the sub-pixel SP of the organic light emitting display apparatus 100 according to one embodiment of the present disclosure.

As shown in FIG. 2B, the organic light emitting display apparatus 100 according to the present disclosure includes the gate line GL, the data line DL, the power line PL, and the sensing line SL crossing each other to define the sub-pixel SP. A driving thin film transistor DT, an organic light emitting device D, a storage capacitor Cst, a first switching thin film transistor ST1, and a second switching thin film transistor ST2 are disposed in the sub-pixel SP.

The organic light emitting device D includes an anode electrode connected to a second node N2, a cathode electrode connected to an input terminal of the low potential driving voltage EVSS, and an organic light emitting layer disposed between the anode electrode and the cathode electrode.

The driving thin film transistor DT controls the current Id flowing through the organic light emitting diode D according to the gate-source voltage Vgs. The driving thin film transistor DT includes a gate electrode connected to a first node N1, a drain electrode connected to the power line PL to provide the high potential driving voltage EVDD, and a source electrode connected to the second node N2.

The storage capacitor Cst is connected between the first node N1 and the second node N2.

When the display panel PAN is operating, the first switching thin film transistor ST1 applies the data voltage Vdata charged in the data line DL to the first node N1 in response to the gate signal SCAN to turn on the driving TFT DT. In this case, the first switching thin film transistor ST1 includes the gate electrode connected to the gate line GL to receive the scan signal SCAN, the drain electrode connected to the data line DL to receive the data voltage Vdata, and the source electrode connected to first node N1.

The second switching thin film transistor ST2 switches the current between the second node N2 and the sensing voltage readout line SRL in response to the sensing signal SEN to store the source voltage of the second node N2 in a sensing capacitor Cx of the readout line SRL. The second switching thin film transistor ST2 switches the current between the second node N2 and the sensing voltage readout line SRL in response to the sensing signal SEN when the display panel PAN is operating to reset the source voltage of the driving thin film transistor DT into the initial voltage Vpre. In this case, the gate electrode of the second switching thin film transistor ST2 is connected to the sensing line SL, the drain electrode is connected to the second node N2, and the source electrode is connected to the sensing voltage readout line SRL.

In the figures, the organic light emitting display device having a 3T1C structure including three thin film transistors and one storage capacitor has been exemplified and described, but the organic light emitting display device of the present disclosure is not limited to this structure. The organic light emitting display device according to the present disclosure may be formed in the various structure such as b 4T1C, 5T1C, 6T1C, 7T1C, and 8T1C.

In the present disclosure, on the other hand, the gate driving unit 130 is formed in the GIP (Gate In Panel) structure, in which the thin film transistors are directly deposited on the substrate of the organic light emitting display apparatus. Hereinafter, the example of the GIP circuit will be described with reference to FIG. 3.

Figure 3:
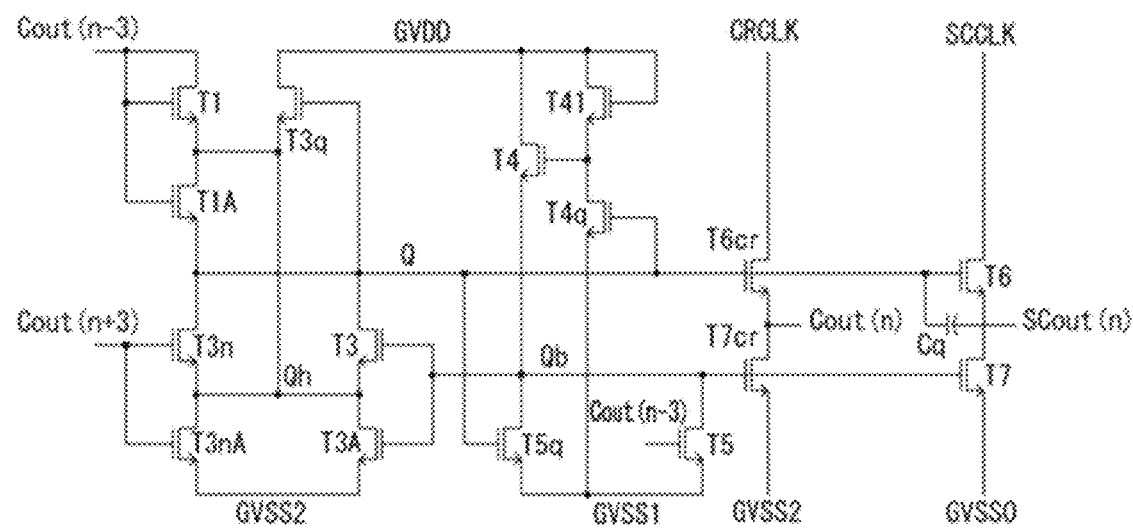
FIG. 3 is the example of a circuit diagram of a gate driving circuit unit disposed in a non-display area of an organic light emitting display apparatus according to one embodiment of the present disclosure.

Referring to FIG. 3, the GIP circuit includes a first output circuit unit for outputting a gate pulse Scout(n) through a first output terminal according to voltages of a Q node and a Qb node, a second output circuit unit for outputting a carry signal Cout(n) through a second output terminal according to the voltages of the Q node and the Qb node, and a switch circuit for charging and discharging the Q node and the Qb node.

The first output circuit unit includes a first pull-up transistor T6 that is turned on when a shift clock SCCLK is inputted in the state that the Q node is pre-charged to charge the voltage of the first output terminal and a first pull-down transistor T7 for discharging the voltage of the first out terminal when the voltage of the Qb node is charged. A capacitor Cq is connected between the Q node and the first output terminal. The first pull-up transistor T6 includes a gate connected to the Q node, a drain to which the shift clock SCCLK is applied, and a source connected to the first output terminal. The first pull-down transistor T7 includes the gate connected to the Qb node, the drain connected to the first output terminal, and the source connected to the GVSS0 node. A gate low voltage VGL0 is applied to the GVSS0 node. The second output circuit unit includes a second pull-up transistor T6cr that is turned on when the shift clock CRCLK is inputted in the state that the Q node is pre-charged to charge the voltage of the second output terminal and a second pull-down transistor T7cr for discharging the voltage of the second out terminal when the voltage of the Qb node is charged. The second pull-up transistor T6cr includes the gate connected to the Q node, the drain to which the shift clock CRCLK is applied, and the source connected to the second output terminal. The second pull-down transistor T7cr includes the gate connected to the Qb node, the drain connected to the second output terminal, and the source connected to the GVSS2 node. The gate low voltage VGL2 is applied to the GVSS2 node. VGL2 can be set to a lower voltage than VGL0.

The switch circuit charges and discharges the Q node, Qb, and Qh nodes using a plurality of TFTs T1, T1A, T3, T3q, T3A, T3n, T3nA, T4, T41, T4q, T5, and T5q.

The thin film transistors T1 and T1A charge the voltages of the Q node and the Qb node as a high voltage (VGH) of the carry signal Cout(n−3) in response to the carry signal Cout(n−3) from the n−3th stage. The thin film transistor T1 includes the gate and the drain to which the carry signal Cout(n−3) is applied, and the source connected to the Qh node. The thin film transistor T1A includes the gate to which the carry signal Cout(n−3) is applied, the drain connected to the Qh node, and the source connected to the Q node.

The thin film transistor T3q is turned on in response to the pre-charged voltage of the Q node to connect the Qh node to GVDD, so that the Qh node is charged with the high voltage (VGH) applied through the GVDD node. The thin film transistor T3q includes the gate connected to the Q node, the drain connected to the GVDD node, and the source connected to the Qh node.

The thin film transistors T3n and T3nA connect the Q node and the Qh node to the GVSS2 node in response to the carry signal Cout(n+3) applied from the next stage to discharge the Q node and the Qh node. The thin film transistor T3n includes the gate to which the carry signal Cout(n+3) is applied, the drain connected to the Q node, and the source connected to the Qh node. The thin film transistor T3nA includes the gate to which the carry signal Cout(n+3) is applied, the drain connected to the Qh node, and the source connected to the GVSS2 node.

The thin film transistors T3 and T3A are turned on in response to the Qb node and then connect the Q and Qh nodes to the GVSS2 node to discharge the Q node. The thin film transistor T3 includes the gate connected to the Qb node, the drain connected to the Q node, and the source connected to the Qh node. The thin film transistor T3A includes the gate connected to the Qb node, the drain connected to the Qh node, and the source connected to the GVSS2 node.

The thin film transistors T4, T41, and T4q charge the Qb node to the high voltage (VGH) when the Q node voltage is in the uncharged state. The thin film transistor T41 includes the gate and the drain connected to the GVDD node to which the high voltage (VGH) is applied, and the source connected to the gate of the thin film transistor T4 and the drain of the thin film transistor T4q. The thin film transistor T4 includes the gate connected to the source of the thin film transistor T41 and the drain of the thin film transistor T4q, the drain connected to the GVDD node, and the source connected to the Qb node. The thin film transistor T4q includes the gate connected to the Q node, the drain connected to the source of the thin film transistor T41 and the gate of the thin film transistor T4, and the source connected to the GVSS1 node. VGL1 is applied to GVSS1. VGL1 can be set to the voltage lower than VGL0 and higher than VGL2.

The thin film transistor T5q is turned on in accordance with the voltage of the pre-charged Q node to connect the Qb node to the GVSS1 node to discharge the Qb node. The thin film transistor T5q includes the gate connected to the Q node, the drain connected to the Qb node, and the source connected to the GVSS1 node.

The thin film transistor T5 is turned on in response to the carry signal Cout(n−3) from the n−3th stage to discharge the Qb node. The thin film transistor T5 includes the gate to which the carry signal Cout(n−3) is applied, the drain connected to the Qb node, and the source connected to the GVSS1 node.

As described above, the thin film transistor disposed in the GIP circuit unit and the thin film transistor disposed in the sub-pixel have different roles, and therefore, should have different operating characteristics. That is, the driving thin film transistor having high-speed operation characteristics are required in the GIP circuit unit, while the driving thin film transistor capable of expressing rich grayscale in low-speed driving is required in the sub-pixel. Further, the switching device having fast operation characteristics and effective blocking characteristics for the leakage current in the off state is required.

In consideration of this point, in the organic light emitting display apparatus according to the present disclosure, the thin film transistor optimized for each role is provided.

Figure 4:
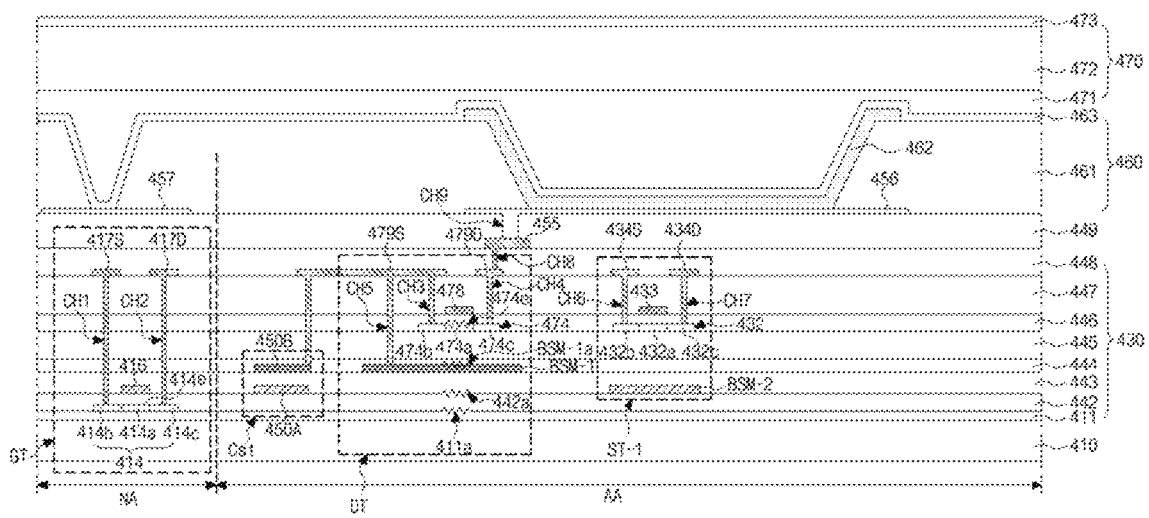
FIG. 4 is a cross-sectional view illustrating the example of a thin film transistor disposed in the gate driving circuit unit of a non-display area and a driving thin film transistor and a switching thin film transistor disposed in a display area in the organic light emitting display apparatus according to a first embodiment of the present disclosure.

FIG. 4 is the view illustrating the first thin film transistor GT, which is one of the thin film transistors disposed in the non-display area NA, particularly, the GIP area, the driving thin film transistor DT disposed in the sub-pixel of the display area AA to drive the organic light emitting device, the first switching thin film transistor ST-1, and the storage capacitor Cst.

Figure 5:
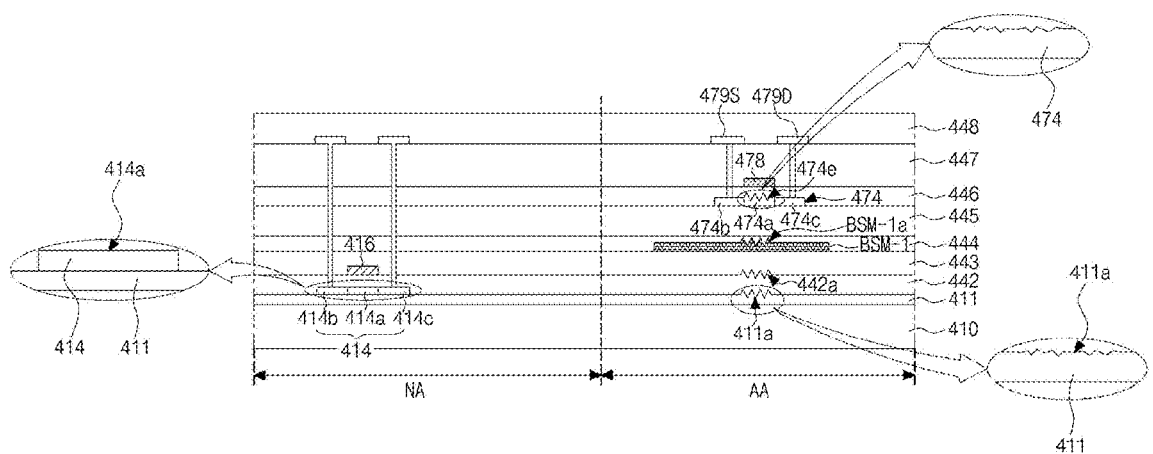
FIG. 5 is an enlarged view comparing a surface state of a polycrystalline semiconductor pattern of the thin film transistor disposed in the non-display area with the surface state of an oxide semiconductor pattern of the driving thin film transistor disposed in the display area according to the first embodiment of the present disclosure.

FIG. 5 is a partial cross-sectional view of FIG. 4, and illustrates the first thin film transistor GT constituting the gate driving circuit unit in the non-display area NA and a part of the pixel circuit unit in the sub-pixel according to one embodiment.

As shown in FIG. 4, the driving thin film transistor DT and the first switching thin film transistor ST-1 are disposed in the sub-pixel on the substrate 410. At this time, although only the driving thin film transistor DT and one switching thin film transistor ST-1 are shown in FIG. 4, this is only for convenience of description. A plurality of switching thin film transistors may be disposed on the substrate 410.

In addition, a plurality of first thin film transistors GT constituting the gate driving circuit unit are disposed in the non-display area NA on the substrate 410.

The first thin film transistor GT includes a first polycrystalline semiconductor pattern 414 (e.g., a first semiconductor material) on a lower buffer layer 411 over the substrate 410, a gate insulating layer 442 for insulating the first polycrystalline semiconductor pattern 414, a first gate electrode 416 overlapped with first polycrystalline semiconductor pattern 414 on the first gate insulating layer 442, a plurality of insulating layers on the first gate electrode 416, and a first source electrode 417S and a first drain electrode 417D on the plurality of insulating layers and connected to the first polycrystalline semiconductor pattern 414.

The substrate 410 may be formed as multi layers in which an organic layer and an inorganic layer are alternately deposited. For example, the substrate 410 may be formed by alternately depositing the organic layer such as polyimide and the inorganic layer such as a silicon oxide (SiO2).

The lower buffer layer 411 is formed on the substrate 410. The lower buffer layer 411 blocks moisture from the outside, and may be formed by depositing the silicon oxide (SiO2) film in multiple layers.

The first polycrystalline semiconductor pattern 414 made of the polycrystalline semiconductor is formed on the lower buffer layer 411. The first polycrystalline semiconductor pattern 414 includes a first channel region 414a through which charges move, a first source region 414b at a first side of the first channel region 414a, and a first drain region 414c at a second side of first channel region 414a that is opposite the first side. The first source region 414b and the first drain region 414c are conductive regions by doping impurity ions such as phosphorus or boron in the intrinsic polycrystalline semiconductor pattern.

The first polycrystalline semiconductor pattern 414 of the first embodiment according to the present disclosure has a planarized surface (e.g., flat) by artificially removing grain boundaries that occur during the growth of the polycrystalline semiconductor.

The first polycrystalline semiconductor pattern 414 is formed by depositing an amorphous semiconductor layer on the substrate and then crystallizing the deposited amorphous semiconductor layer by applying heat using a laser irradiation method or the like. In a polycrystalline semiconductor, grains, which are single crystal regions, collide with neighboring grains as they grow, and the boundary portion rises above the surface by the collision (this rise area is called a grain boundary). Since this grain boundary may have a different distribution density for each position of the substrate, the grain boundary serves as a barrier that prevents the movement of the charges, as a result the polycrystalline semiconductor pattern may have different electrical mobility depending on the position of the substrate.

However, the first thin film transistor constituting the gate driving circuit unit should have high-speed driving characteristics and the same driving characteristics regardless of the position thereof. Accordingly, in the first thin film transistor according to the first embodiment of the present disclosure, the grain boundary is removed by artificially performing the planarization process on the first polycrystalline semiconductor pattern 414. That is, referring to FIG. 5, the first polycrystalline semiconductor pattern 414 includes a first surface treatment layer 414a (e.g., a first surface) of which surface is planarized. As shown in FIG. 5, the first surface treatment layer 414a is farther from the substrate 410 than a second surface of the first polycrystalline semiconductor pattern 414 that is opposite the first surface treatment layer 414a.

The surface of the first polycrystalline semiconductor pattern 414 may be planarized by a mechanical method. However, in the present disclosure, a wet etching method capable of preventing physical damage to the first polycrystalline semiconductor pattern 414 is used. However, the present disclosure does not exclude the use of the mechanical method as the surface planarization process. In the first embodiment of the present disclosure, an ideal target of the first polycrystalline semiconductor pattern 414 is that the top surface thereof is planarized so that the surface roughness is substantially "0".

The first polycrystalline semiconductor pattern 414 includes the first channel region 414a, and the first source region 414b and the first drain region 414c at both sides of first channel region 414a.

The first gate insulating layer 442 is formed by depositing the inorganic insulating layer such as silicon oxide (SiO2) on the entire surface of the substrate 410 on which the first polycrystalline semiconductor pattern 414 is formed. The first gate insulating layer 442 protects and insulates the first polycrystalline semiconductor pattern 414 from the outside.

The first gate electrode 416 is made of the metal. For example, the first gate electrode 416 may be formed in the single layer or the multi layers made of molybdenum (Mo), aluminum (Al), chromium (Cr), gold (Au), titanium (Ti), nickel (Ni), neodymium (Nd), copper (Cu), or an alloy thereof, but is not limited thereto.

The first gate electrode 416 is disposed on the first gate insulating layer 442 so as to overlap with the first channel region 414a.

A plurality of insulating layers may be formed between the first gate electrode 416 and the first source electrode 417S and the first drain electrode 417D.

As shown in FIG. 4, the plurality of insulating layers may include a first interlayer insulating layer 443 contacting the upper surface of the first gate electrode 416, a second interlayer insulating layer 444 on the first interlayer insulating layer 443, an upper buffer layer 445, a second gate insulating layer 446, and a third interlayer insulating layer 447.

The first source electrode 417S and the first drain electrode 417D are disposed on the third interlayer insulating layer 447. The first source electrode 417S and the first drain electrode 417D are respectively connected to the first source region 414b and the first drain region 414c through a first contact hole CH1 and a second contact hole CH2 formed in the first gate insulating layer 442, the first interlayer insulating layer 443, the second interlayer insulating layer 444, the upper buffer layer 445, the second gate insulating layer 446, and the third interlayer insulating layer 447.

The driving thin film transistor DT, the first switching thin film transistor ST-1, and the storage capacitor Cst are disposed in the sub-pixel of the display area.

The driving thin film transistor DT is disposed on the upper buffer layer 445.

In the first embodiment of the present disclosure, the driving thin film transistor DT includes a first oxide semiconductor pattern 474 (e.g., a second semiconductor material), a second gate electrode 478 overlapped with the first oxide semiconductor pattern 474, a second source electrode 479S, and a second drain electrode 479D.

The oxide semiconductor may be made by the oxide of the metal zinc (Zn), indium (In), gallium (Ga), tin (Sn), or titanium (Ti). Further, the oxide semiconductor may be made of a combination of the metal such as zinc (Zn), indium (In), gallium (Ga), tin (Sn), or titanium (Ti) and the oxide thereof. More specifically, the oxide semiconductor may be made of zinc oxide (ZnO), zinc-tin oxide (ZTO), zinc-indium oxide (ZIO), indium oxide (InO), titanium oxide (TiO), indium-gallium-zinc oxide (IGZO), and the like.

Conventionally, a polycrystalline semiconductor pattern advantageous for high-speed driving was used as an active layer of the driving thin film transistor. However, the driving thin film transistor including the polycrystalline semiconductor pattern has the problem in that power is consumed due to leakage current in the off state. In particular, the power consumption problem in the off state becomes more problematic when the display apparatus drives at a low speed such as a still image displaying a document screen. Accordingly, in the first embodiment of the present disclosure, the driving thin film transistor using the oxide semiconductor pattern capable of preventing leakage current as the active layer is proposed.

However, when the oxide semiconductor pattern is used as the active layer of the thin film transistor, since the current fluctuation value with respect to the unit voltage fluctuation value increases due to the material characteristics of the oxide semiconductor, the defects occur in the low grayscale region where precise current control is required. Accordingly, the present disclosure provides the driving thin film transistor in which the change value of the current in the active layer is relatively insensitive to the change value of the voltage applied to the gate electrode.

Referring to FIGS. 4 and 5, the driving thin film transistor DT is disposed on the upper buffer layer 445. The driving thin film transistor DT includes the first oxide semiconductor pattern 474 of which the surface is roughly treated to include a plurality of protrusions on a surface of the first oxide semiconductor pattern 474, the second gate insulating layer 446 covering the first oxide semiconductor pattern 474, the second gate electrode 478 overlapped with the first oxide semiconductor pattern 474 on the second gate insulating layer 446, the third interlayer insulating layer 447 covering the second gate electrode 478, and the second electrode 479S and the second drain electrode 479D that are connected to the first oxide semiconductor pattern 474.

In particular, the driving thin film transistor DT includes the second surface treatment layer 474e in which the upper surface of the first oxide semiconductor pattern 474 is roughly treated.

When the surface of the active layer, that is, the surface of the oxide semiconductor pattern, is roughened to include a plurality of protrusions, the S-factor value increases, and thus the voltage range capable of controlling the organic light emitting device at a low gray scale is widened. That is, when the roughness of the upper surface of the oxide semiconductor pattern increases due to the plurality of protrusions, the distortion is generated at the interface of the oxide semiconductor pattern. Since this distortion prevents or at least reduces the increase in current when the voltage is applied, the S-factor ratio of the driving thin film transistor increases due to the increase of roughness resulting from the plurality of protrusions.

Accordingly, the first oxide semiconductor pattern 474 of the present disclosure includes the second surface treatment layer 474e of which the upper surface is roughly treated to include a plurality of protrusions, and in particular, the second surface treatment layer 474e with the plurality of protrusions is overlapped with the second channel region 474a.

For reference, the S-factor, commonly referred to as the "sub-threshold slope," represents the voltage required to increase the current tenfold. The S-factor is the inverse value of the slope of the graph of the voltage region lower than the threshold voltage in the graph (I-V curve) representing the characteristics of the drain current with respect to the gate voltage.

When the S-factor is small, since the slope of the characteristic graph (I-V) of the drain current with respect to the gate voltage is large, the thin film transistor is turned on even by a small voltage, and thus the switching characteristics of the thin film transistor are improved. On the other hand, since the threshold voltage is reached in a short time, it is difficult to express sufficient gradation.

When the S-factor is large, since the slope of the characteristic graph (I-V) of the drain current with respect to the gate voltage is small, the on/off reaction speed of the thin film transistor is lowered. Therefore, although the switching characteristics of the thin film transistor are deteriorated, the threshold voltage is reached over a relatively long time, so that sufficient grayscale expression is possible.

In addition, the first oxide semiconductor pattern 474 which is the active layer includes the second channel region 474a through which charges move, and the second source region 474b and the second drain region 474c at both sides of the second channel region 474a.

The second channel region 474a may be made of the intrinsic oxide semiconductor in which the impurities not doped. Further, the second source region 474b and the second drain region 474c are the conductive regions by doping the intrinsic oxide semiconductor with impurity ions of Group 3 or 5.

Meanwhile, a first light blocking pattern BSM-1 is formed under the first oxide semiconductor pattern 474. The first light blocking pattern BSM-1 may be a metal pattern that blocks external light irradiated to the first oxide semiconductor pattern 474 to prevent malfunction of the first oxide semiconductor pattern 474.

A surface roughness transfer pattern BSM-1a (e.g., a plurality of protrusions) is formed on a portion of the upper surface of the first light blocking pattern BSM-1 that overlaps the second surface treatment layer 474e, and the second surface treatment layer 474e is formed on the upper surface of the first oxide semiconductor pattern 474, and the second surface treatment layer 474e is formed on the upper surface of the first oxide semiconductor patter 474 due to the surface roughness transfer pattern BSM-1a. That is, when the second interlayer insulating layer 444, the upper buffer layer 445, and the first oxide semiconductor pattern 474 are formed on the upper surface of the first light blocking pattern BSM-1 on which the surface roughness transfer pattern BSM-1a is formed, a surface curvature of the surface roughness transfer pattern BSM-1a of the first light blocking pattern BSM-1 is transferred to the insulating layers and the first oxide semiconductor pattern 474 formed thereon so that the first oxide semiconductor pattern 474 has the second surface treatment layer 474e.

Further, the surface roughness transfer pattern BSM-1a of the first blocking pattern BSM-1 is caused by the surface roughness transfer pattern 411a (e.g., a plurality of protrusions) of the lower buffer layer 411 thereunder. The surface roughness transfer pattern 411a of the lower buffer layer 411 transfers the surface curvature to the first gate insulating layer 442 thereon. In addition, the surface roughness transfer pattern 442a (e.g., a plurality of protrusions) of the first gate insulating layer 442 transfers the surface curvature to the first light blocking pattern BSM-1 thereon to form the surface roughness transfer pattern BSM- of the first light blocking pattern BSM-1. As this process is repeated, the second surface treatment layer 474e is formed on the first oxide semiconductor pattern 474. The process will be described with reference to FIGS. 8A to 8D below.

Further, in the embodiment of the present disclosure, the first blocking pattern BSM-1 may be made of the metal layer including a titanium (Ti) having excellent ability to trap hydrogen particles. For example, the metal layer may be formed of the single layer of titanium, the multi layers of molybdenum (Mo) and titanium (Ti), or the alloy of molybdenum (Mo) and titanium (Ti). However, the present disclosure is not limited thereto, and other metal layers including titanium (Ti) are also possible.

Titanium (Ti) may trap hydrogen particles diffusing into the upper buffer layer 445 to prevent penetration of the hydrogen particles into the first oxide semiconductor pattern 474. Therefore, in the driving thin film transistor DT according to the embodiment of the present disclosure, since the first light blocking pattern BSM-1 is made of the metal such as titanium having good hydrogen-trapping characteristics, the second surface treatment layer 474e is formed to increase the S-factor value of the oxide semiconductor pattern, and the S-factor value is increased, the reliability of the driving thin film transistor DT may be improved and the control range of the driving thin film transistor may be widened at a low gray level.

The first blocking pattern BSM-1 is formed vertically below the first oxide semiconductor pattern 474 to overlap the first oxide semiconductor pattern 474. Further, the first blocking pattern BSM-1 may be larger (wider) than the first oxide semiconductor pattern 474 to completely overlap the first oxide semiconductor pattern 474.

Further, the first blocking pattern BSM-1 includes the surface roughness transfer pattern BSM-1a on the upper surface thereof. The shape of the upper surface of the surface roughness transfer pattern BSM-1a is transferred to the first oxide semiconductor pattern 474 to form the second surface treatment layer 474e on the upper surface of the first oxide semiconductor pattern 474.

Meanwhile, the second source electrode 479S of the driving thin film transistor DT may be electrically connected to the first blocking pattern BSM-1. When the first blocking pattern BSM-1 is electrically connected to the second source electrode 479S, the following additional effects may be obtained.

When the second source region 474b and the second drain region 474c of the first oxide semiconductor pattern 474 are doped with the impurities, the parasitic capacitance Cact is generated inside the first oxide semiconductor pattern 474 and the parasitic capacitance Cgi is generated between the second gate electrode 478 and the first oxide semiconductor pattern 474. Further, the parasitic capacitance Cbuf is generated between the first light blocking pattern BSM-1 electrically connected to the second source electrode 479S and the first oxide semiconductor pattern 474.

Since the first oxide semiconductor pattern 474 and the first light blocking pattern BSM-1 are electrically connected by the second source electrode 479S, the parasitic capacitance Cact and the parasitic capacitance Cbuf are connected in parallel to each other, and the parasitic capacitance Cact and the parasitic capacitance Cgi is connected in series to each other. Further, when the gate voltage of Vgat is applied to the second gate electrode 478, the effective voltage Veff($\Delta$V) actually applied to the first oxide semiconductor pattern 474 is calculated by the following formula.

$$\Delta V = Cgi/(Cgi + Cact + Cbuf) \times \Delta Vgat$$

Accordingly, since the effective voltage applied to the second channel region 474a is in inversely proportional to the parasitic capacitance Cbuf, the effective voltage applied to the first oxide semiconductor pattern 474 may be adjusted by the parasitic capacitance Cbuf.

That is, if the parasitic capacitance value Cbuf is increased by disposing the first light blocking layer BSM-1 close to the first oxide semiconductor pattern 474, the actual current value flowing through the first oxide semiconductor pattern 474 may be reduced.

The reduction of the effective current flowing through the first oxide semiconductor pattern 474 means that the control range of the driving thin film transistor DT to be controlled by the voltage Vgat actually applied to the second gate electrode 478 is widened.

Therefore, when the second source electrode 479S of the driving thin film transistor DT and the first light blocking pattern BSM-1 are electrically connected, the organic light emitting device can be precisely controlled even at a low gray level, so that the problem of screen spot can be solved.

In addition, in the driving thin film transistor DT, the second gate electrode 478 is disposed over the first oxide semiconductor pattern 474. The second gate electrode 478 may be overlapped with the second channel region 474a. The second gate insulating layer 444 is interposed between the second gate electrode 478 and the first oxide semiconductor pattern 474.

The second source electrode 479S and the second drain electrode 479D are formed over the second gate electrode 478.

The third interlayer insulating layer 447 may be interposed between the second source electrode 479S and the second drain electrode 479D and the second gate electrode 478.

The second source electrode 479S is connected to the second source region 474b through the third contact hole CH3 formed in the second gate insulating layer 446 and the third interlayer insulating layer 447. The second drain electrode 479D is connected to the second drain region 474c through the fourth contact hole CH4 formed in the second gate insulating layer 446 and the third interlayer insulating layer 447.

Meanwhile, the second source electrode 479S may be connected to the first light blocking pattern BSM-1 through fifth contact hole CH5 formed in the second interlayer insulating layer 443, the upper buffer layer 445, the second gate insulating layer 446, and the third interlayer insulating layer 447.

The first switching thin film transistor ST-1 including the oxide semiconductor pattern is disposed in a sub-pixel. The first switching thin film transistor ST-1 may be disposed between the data line and the driving thin film transistor DT.

Although only one switching thin film transistor is shown in FIG. 4, two or more switching thin film transistors may be disposed in the sub-pixel. That is, various numbers of switching thin film transistors may be disposed in the sub-pixel according to various circuit configurations such as 3T1C, 4T1C, 5T1C, 6T1C, 7T1C, etc.

The first switching thin film transistor ST-1 includes the second oxide semiconductor pattern 432, the third gate electrode 433, the third source electrode 434S, and the third drain electrode 434D.

The second oxide semiconductor pattern 432 includes the third channel region 432a, and the third source region 432b at a first side of the third channel region 432a and the third drain region 432c at a second side of the third channel region 432a that is opposite the first side. In one embodiment, a surface of the second oxide semiconductor pattern 432 lacks protrusions.

The third gate electrode 433 is disposed over the second oxide semiconductor pattern 432 with the second gate insulating layer 447 interposed therebetween.

The third source electrode 434S and the third drain electrode 434D are disposed over the third gate electrode 433 with the third interlayer insulating layer 447 interposed therebetween.

The third source electrode 434S and the third drain electrode 434D are respectively connected to the third source region 432b and the third drain region 432c through the sixth contact hole CH6 and the seventh contact hole CH7 formed in the second gate insulating layer 446 and the third interlayer insulating layer 447.

The second light blocking pattern BSM-2 may be disposed under the second oxide semiconductor pattern 432.

The second light blocking pattern BSM-2 is disposed under the second oxide semiconductor pattern 432 and overlapped with the second oxide semiconductor pattern 432, so that the second oxide semiconductor pattern 432 can be protected from the external light.

The second light blocking pattern BSM-2 may be disposed on the first gate insulating layer 442. However, since the second blocking pattern BSM-2 may reduce the S-factor value of the second oxide semiconductor pattern 432. Accordingly, as another embodiment, the second blocking pattern BSM-2 may not be disposed under the second oxide semiconductor pattern 432.

When the second light blocking pattern BSM-2 is disposed under the second oxide semiconductor pattern 432, the second light blocking pattern BSM-2 is disposed on a layer that is lower than the layer on which the first blocking pattern BSM-1 is disposed. That is, since the second blocking pattern BSM-2 is disposed on the lower layer than the layer on which the first blocking pattern BSM-1 is disposed, the distance between the second oxide semiconductor pattern 432 and the second light blocking pattern BSM-2 is greater than the distance between the first light blocking pattern BSM-1 and the first oxide semiconductor pattern 474. Since the second light blocking pattern BSM-2 is disposed under the second oxide semiconductor pattern 432 and the second blocking pattern BSM-2 is disposed on the lower layer than the layer on which the first blocking pattern BSM-1 is disposed, so that the first switching thin film transistor ST-1 can have high-speed operation characteristics. Of course, the first switching thin film transistor ST-1 may not include the second light blocking pattern BSM-2.

Meanwhile, referring to FIG. 4, the sub-pixel further includes the storage capacitor Cst.

The storage capacitor Cst stores the data voltage applied through the data line for a certain period of time and provides the data voltage to the organic light emitting device.

The storage capacitor Cst includes two electrodes overlapping each other and a dielectric disposed therebetween. The storage capacitor Cst includes a first electrode 450A made of the same material on the same layer as the first gate electrode 416 and a second electrode 450B made of the same material on the same layer as the first light blocking pattern BSM-1.

The first interlayer insulating layer 443 is interposed between the first electrode 450A and the second electrode 450B of the storage capacitor.

The second electrode 450B of the storage capacitor may be electrically connected to the second source electrode 479S.

In the first embodiment of the present disclosure, since a plurality of metal patterns and a plurality of contact holes are formed, it may be necessary to reduce the mask process.

Referring to FIG. 4, the first gate electrode 416, the first electrode 450A of the storage capacitor, and the second light blocking pattern BSM-2 may be made of same material on the same layer. In other word, they can be formed by one mask process.

Further, the second electrode 450B of the storage capacitor and the first light blocking pattern BSM-1 may be formed by one mask process.

The first oxide semiconductor pattern 474 and the second oxide semiconductor pattern 432 may also be formed by one mask process.

Further, the first source electrode 417S, the first drain electrode 417D, the second source electrode 479S, the second drain electrode 479D, the third source electrode 434S, and the third drain electrode 434D may be formed by one mask process.

One mask process includes a photolithography process having a series of processes of deposition, exposure, etching, and cleaning.

Referring to FIG. 4, the first planarization layer 448 is formed on the substrate 410 on which the driving thin film transistor DT and the first switching thin film transistor ST-1 are disposed. The first planarization layer 448 may be made of the organic material such as photoacrylic, but may also include a plurality of layers having the inorganic layer and the organic layer. The connection electrode 455 is formed on the first planarization layer 448. The connection electrode 455 electrically connects the first electrode 456 which is a component of the light emitting device 460 and the driving thin film transistor DT.

The second planarization layer 449 may be formed on the connection electrode 455. The second planarization layer 449 may be made of the organic material such as photoacrylic, but may also include a plurality of layers having the inorganic layer and the organic layer.

The first electrode 456 electrically connected to the second drain electrode 479D of the driving transistor DT through the ninth contact hole CH9 and ninth contact hole CH9 is formed on the second planarization layer 449. The first electrode 456 is formed of the single layer or the multi layers made of the metal such as Ca, Ba, Mg, Al, Ag, or an alloy thereof. The first electrode 456 is connected to the second drain electrode 479D of the driving transistor DT to receive an image signal from the outside. In the non-display area NA, the first connection electrode 457 electrically connecting the common voltage line VSS and the second electrode 463 may be further formed.

A bank layer 461 is formed on the second planarization layer 449. The bank layer 461 is a barrier wall, and can prevent the light of a specific color output from the adjacent pixels from being mixed and output by partitioning each sub-pixel SP.

The organic light emitting layer 462 is formed on the first electrode 456 and a portion of the inclined surface of the bank layer 461. The organic light emitting layer 462 may include an R organic light emitting layer to emit red light, a G organic light emitting layer to emit green light, and a B organic light emitting layer to emit blue light, which are formed in the R, G, and B pixels. Further, the organic light emitting layer 462 may include a W organic light emitting layer to emit white light.

The organic light emitting layer 462 may include a light emitting layer, an electron injecting layer and a hole injecting layer for respectively injecting electrons and holes into the light emitting layer, and an electron transporting layer and a hole transporting layer for respectively transporting the injected electrons and holes to the organic layer.

The second electrode 463 may be made of the transparent conductive material such as indium tin oxide (ITO) or indium zinc oxide (IZO). Further, the second electrode 463 may be made of a thin metal through which visible light is transmitted, but is not limited thereto.

An encapsulating layer 470 is formed on the second electrode 463. The encapsulating layer 470 may be composed of the single layer made of the inorganic layer, may be composed of two layers of inorganic layer/organic layer, or may be composed of three layers of inorganic layer/organic layer/inorganic layer. The inorganic layer may be formed of the inorganic material such as SiNx and SiX, but is not limited thereto. Further, the organic layer may be formed of the organic material such as polyethylene terephthalate, polyethylene naphthalate, polycarbonate, polyimide, polyethylene sulfonate, polyoxymethylene, polyarylate, or a mixture thereof, but is not limited thereto.

In FIG. 4, as the example of the encapsulation layer 470, the encapsulation layer 470 including a plurality of layers of the inorganic layer 471, the organic layer 472, and the inorganic layer 473 is disclosed.

Although not shown in figure, a cover glass may be disposed on the encapsulation layer 470 and is attached by an adhesive layer. As the adhesive layer, any material may be used as long as it has good adhesion and good heat resistance and water resistance. In the present disclosure, a thermosetting resin such as an epoxy-based compound, an acrylate-based compound, or an acrylic rubber may be used. In addition, a photocurable resin may be used as the adhesive. In this case, the adhesive layer is cured by irradiating the adhesive layer with light such as ultraviolet rays The adhesive layer bonds the substrate 410 and the cover glass together, and may also serve as an encapsulation layer for blocking moisture into the display device.

The cover glass is an encapsulation cap for encapsulating the electroluminescent display device. As the cover glass, a protective film such as a polystyrene (PS) film, a polyethylene (PE) film, a polyethylene naphthalate (PEN) film, or a polyimide (PI) film may be used, or glass may be used.

Referring to FIG. 5, in the embodiment of the present disclosure, the polycrystalline semiconductor pattern 414 of the first thin film transistor GT in the gate driving unit of the non-display area includes the first surface treatment layer 414 of which the surface planarized, the performance according to the position where the first thin film transistor GT is formed in the non-display area may be reduced. In addition, since the driving thin film transistor DT disposed in the sub-pixel of the display area includes the second surface treatment layer 474e whose surface is roughened with the plurality of protrusions, the S-factor ratio of the driving thin film transistor DT is decreased and thus the spot problem in low grayscale can be solved.

Figure 6:
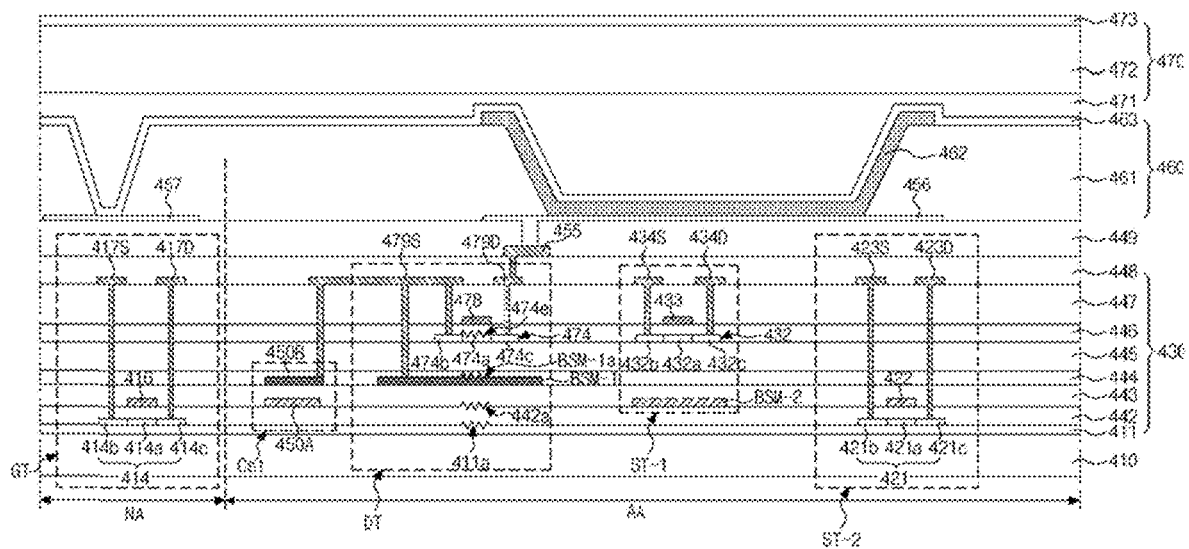
FIG. 6 is the cross-sectional view illustrating the example of the thin film transistor disposed in the gate driving circuit unit of the non-display area and the driving thin film transistor and the switching thin film transistor disposed in the display area in the organic light emitting display apparatus according to a second embodiment of the present disclosure.

FIG. 6 is the view illustrating another embodiment of the present disclosure and discloses the display apparatus further including a second switching thin film transistor ST-2 of which the active layer is a second polycrystalline semiconductor pattern 421 in the sub-pixel.

The driving circuit portion 430 of the sub-pixel may include one driving thin film transistor DT and at least one switching thin film transistor. In particular, 2 to 6 switching thin film transistors may be disposed in the sub-pixel depending on whether the pixel circuit portion 430 of the sub-pixel is 3T1C, 4T1C, 5T1C, 6T1C, 7T1C, or the like. The sub-pixel includes one driving thin film transistor having the oxide semiconductor pattern and at least one switching thin film transistor having the oxide semiconductor pattern in the first embodiment of the present disclosure shown in FIG. 4, whereas the sub-pixel switching thin film transistor shown in FIG. 6 includes the first switching thin film transistor ST-1 having the oxide semiconductor pattern and the second switching thin film transistor having the polycrystalline semiconductor pattern (ST-2) in the second embodiment of the present disclosure. Other configurations may be the same as those of the first embodiment shown in FIG. 4.

Since the second switching thin film transistor ST-2 has the same structure as the first thin film transistor GT of the gate driving unit, the second switching thin film transistor ST-2 may be formed in the sub-pixel.

The switching thin film transistors in the sub-pixel may be subdivided into emission transistors, initialization transistors, switching transistors, and the like according to their roles. When high-speed driving characteristics are required, the switching thin film transistor including the polycrystalline semiconductor pattern with high electrical mobility can be formed.

Referring to FIG. 6, the second switching thin film transistor ST-2 includes the second polycrystalline semiconductor pattern 421 on the lower buffer layer 411 of the substrate 410, the first gate insulating layer 442 for insulating the second polycrystalline semiconductor pattern 421, the third gate electrode 422 overlapped with the second polycrystalline semiconductor pattern 421 on the first gate insulating layer 442, the plurality of insulating layers formed on the third gate electrode 422 and the fourth source electrode 423S and the fourth drain electrode 423D the insulating layers.

The second switching thin film transistor ST-2 may constitute any one of the initialization thin film transistor, the emission thin film transistor, and the switching thin film transistor among pixel circuit portions in the sub-pixel. The rest of the configuration may be the same as that of the embodiment of the present disclosure of FIG. 4.

Figure 7:
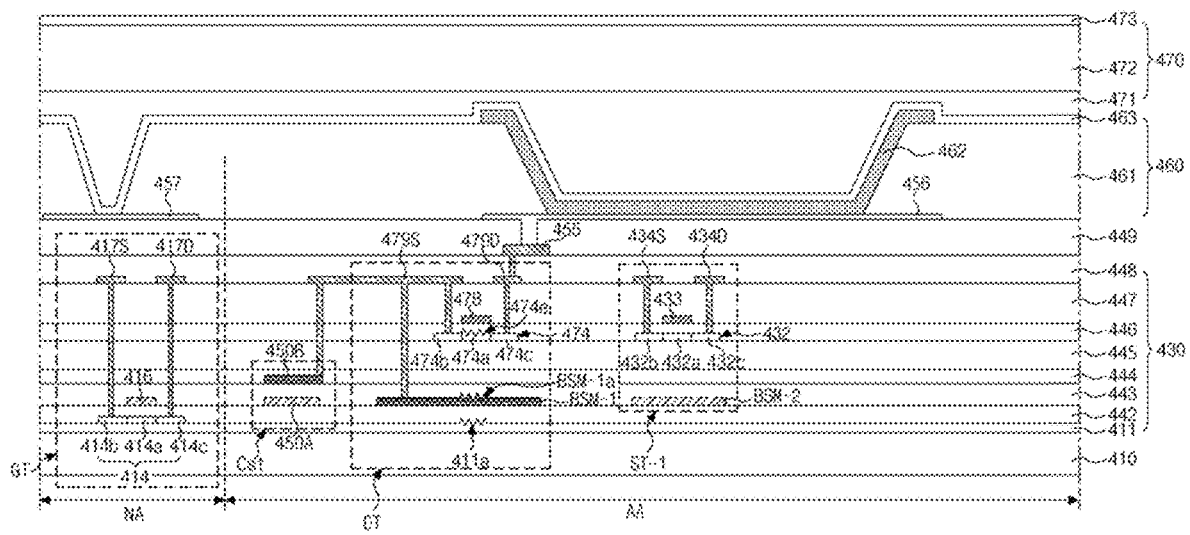
FIG. 7 is the cross-sectional view illustrating the example of the thin film transistor disposed in the gate driving circuit unit of the non-display area and the driving thin film transistor and the switching thin film transistor disposed in the display area in the organic light emitting display apparatus according to a third embodiment of the present disclosure.

In the third embodiment of the present disclosure referring to FIG. 7, the arrangement of the first light blocking pattern BSM-1 of the driving thin film transistor DT disposed in the sub-pixel is different from that of the first embodiment. That is, in the third embodiment, the first light blocking pattern BSM-1 may be disposed on the upper surface of the first gate insulating layer 442. In addition, the first light blocking pattern BSM-1 is electrically connected to the second source electrode 479S.

With this configuration, the distance between the first oxide semiconductor pattern 474 and the first light blocking pattern BSM-1 is greater than that in the first embodiment of FIG. 4. As a result, referring to Equation 1 described above, the decrease in the s-factor value may be less than that in the first embodiment due to the parasitic capacitance generated between the respective layers in the driving thin film transistor DT. However, since the first oxide semiconductor pattern 474 of this embodiment has the second surface treatment layer 474e (e.g., the protrusions) on its surface, the S-factor value of the driving thin film transistor DT may be further reduced so that the desired performance of the driving thin film transistor DT can be realized by appropriately adjusting the two factors.

Accordingly, the position of the first light blocking pattern BSM-1 is not limited to the surface of the first gate insulating layer 442 or the surface of the first interlayer insulating layer 443. The first light blocking pattern BSM-1 may be formed at the various positions.

Hereinafter, the manufacturing process of the organic light emitting display apparatus of the present disclosure will be described with reference to FIGS. 8A to 8F For convenience of description, the process for forming the first surface treatment layer on the first polycrystalline semiconductor pattern 414 of the non-display area NA according to the first embodiment of the present disclosure will be described.

Figure 8A:
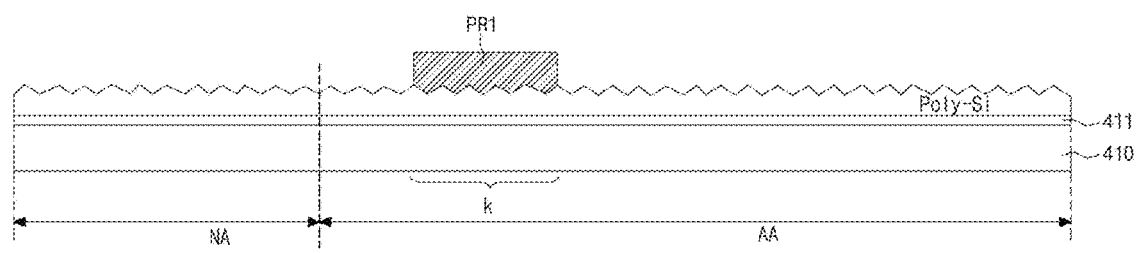
FIGS. 8A to 8F are the cross-sectional views illustrating process of manufacturing the organic light emitting display apparatus according to the first embodiment of the present disclosure.

Referring to FIG. 8A, the lower buffer layer 411 is formed on the substrate 410. The substrate 410 may be formed of the transparent glass substrate or the flexible organic layer. The lower buffer layer 411 may be formed by depositing the inorganic insulating layer such as silicon oxide (SiO2) or silicon nitride (SiNx) by the chemical vapor deposition (CVD) process. The lower buffer layer 411 protects the thin film transistor formed in the subsequent process from impurities such as alkali ions from the substrate 410 or blocks moisture from the outside. The lower buffer layer 411 may be formed of the single layer or the multi layers.

Subsequently, the amorphous silicon layer is deposited on the lower buffer layer 411 and then deposited amorphous silicon is crystallized. The amorphous silicon layer may be crystallized by a sequential lateral solidification crystallization method of irradiating a laser or the like to the amorphous silicon layer or a metal induced lateral solidification crystallization method. At this time, during the crystallization process, as the crystallization proceeds around the nucleus, the grain boundary is formed at the boundary between grains, which are single crystal regions. The grain boundaries may be typically raised upwards of 10 nanometers or more.

The degree to which the grain boundary is raised upward can be controlled by pre-rinsing with hydrogen fluoride or deionized rinsing water.

Thereafter, a first etch stop layer PR1 is formed on the crystallized polycrystalline semiconductor layer Poly-Si to cover the region where the surface roughness transfer pattern is required. In the first embodiment of the present disclosure, the region where the surface roughness transfer pattern is required is a third region k in which the first oxide semiconductor pattern 474 of the driving thin film transistor DT is disposed in the sub-pixel regions Subsequently, the surface of the polycrystalline semiconductor layer is wet-etched to planarize the polycrystalline semiconductor layer using the first etch stop layer PR1 as an etch stop mask. In this case, a wet etching solution containing sulfur hexafluoride (SF6) and chlorine (Cl2) may be used.

The polycrystalline semiconductor layer Poly-Si is used as the first polycrystalline semiconductor pattern 414 of the first thin film transistor GT in the non-display area. The wet etching is to planarize the surface of the first polycrystalline semiconductor pattern 414

The wet etching is performed until the grain boundary of the upper surface of the polycrystalline semiconductor layer Poly-Si is completely planarized.

Figure 8B:
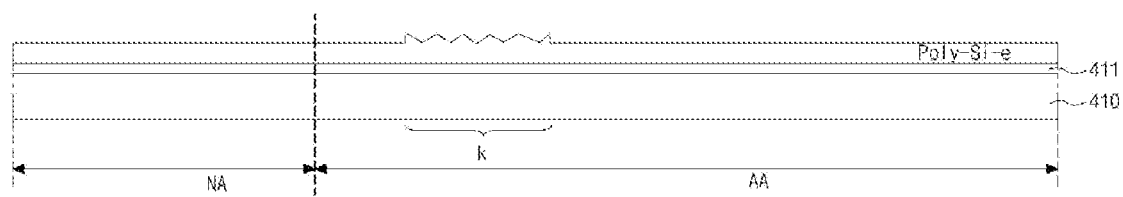

As a result, as shown FIG. 8B, the upper surface of the polycrystalline semiconductor layer Poly-Si-e is planarized except for the third region k where the first oxide semiconductor pattern 474 of the driving thin film transistor DT is disposed. That is, the upper surface of the polycrystalline semiconductor layer of the third region k in which the first oxide semiconductor pattern 474 is disposed is maintained in the rough state due to the grain boundary.

Figure 8C:
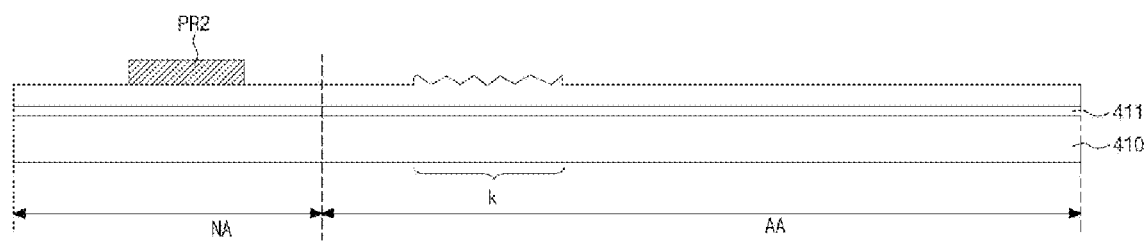
Figure 8D:
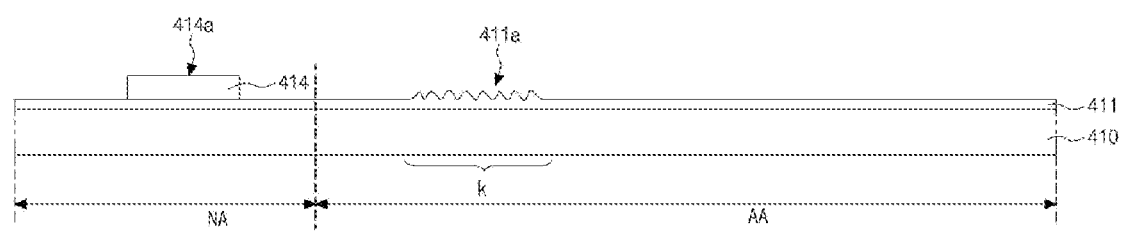

Subsequently, as shown in FIG. 8C, a second etch stop layer PR2 is formed on the polycrystalline semiconductor layer Poly-Si-e on which the surface planarization has been performed. The second etch stop layer PR2 is the photoresist layer pattern defining the first polycrystalline semiconductor pattern 414.

The polycrystalline semiconductor layer Poly-Si-e on which the surface planarization has been performed is dry-etched using the second etch stop layer PR2. By dry etching, the polycrystalline semiconductor layer on the substrate is removed except for the area blocked by the second etch stop layer PR2.

In this process, the surface roughness state of the third region k in which the first oxide semiconductor pattern 474 is disposed is transferred to the lower buffer layer 411 there below, and the surface roughness transfer pattern 411a of the lower buffer layer 411 is formed. In this process, further, the first polycrystalline semiconductor pattern 414 is formed together. The first polycrystalline semiconductor pattern 414 has the first surface treatment layer 414a because its surface has been planarized.

Thereafter, the first gate insulating layer 442, the first gate electrode 416, and a first metal layer for the first electrode of the storage capacitor and the second light blocking pattern BSM-2 are formed over the lower buffer layer 411 on which the first polycrystalline semiconductor patter 414 and the first surface treatment layer 414a, and then the photolithography process is performed. Subsequently, the first interlayer insulating layer 443 is formed on the first metal layer and the second metal layer for the second electrode 450B of the storage capacitor and the first light blocking patten BSM-1 are deposited on the first interlayer insulating layer 443, and then the photolithography process is performed.

Since the various inorganic insulating layer and the metal layer formed on the surface roughness transfer pattern 411a of the lower buffer layer 411 have the thickness of about 40 nm to 250 nm, the surface state of the surface roughness transfer pattern 411a of the lower buffer layer 411 having the thickness of about 10 nm is transferred to various layers formed thereon. As a result, the second surface treatment layer 474e is formed on the first oxide semiconductor pattern 474.

The thickness of the surface roughness transfer pattern 411a of the lower buffer layer 411 may be determined according to the thickness of the layers thereon. Accordingly, the surface roughness transfer pattern 411a of the lower buffer layer 411 may be 5 nm or more.

Figure 8E:
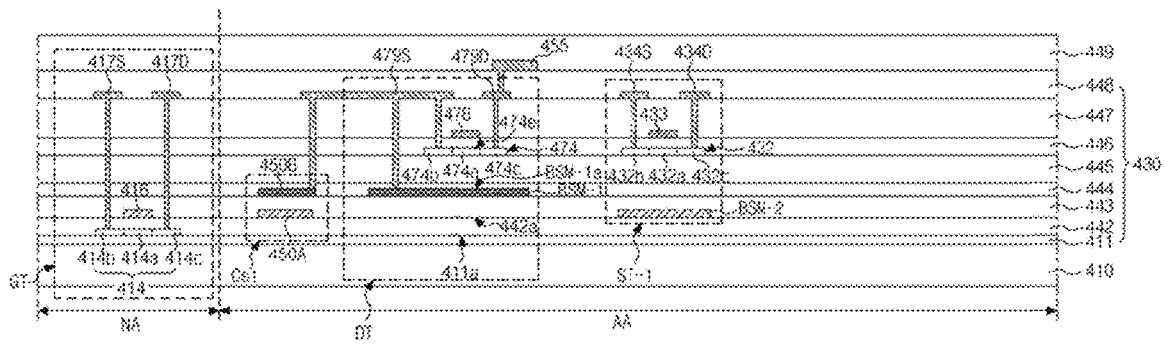
Figure 8F:
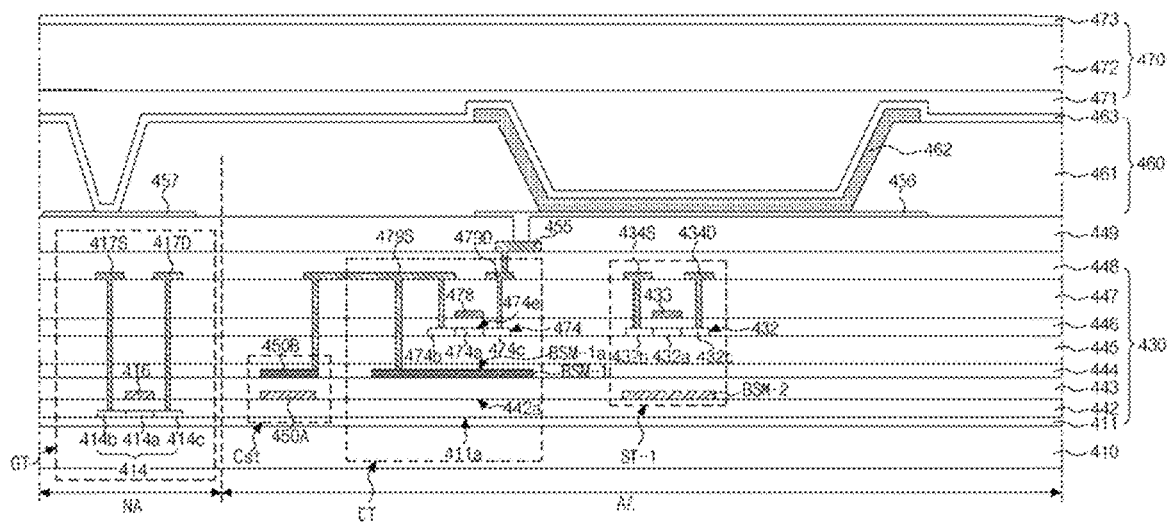

As shown in FIG. 8E, the first gate insulating layer 442 is formed on the lower buffer layer 411 on which the surface roughness transfer pattern 411a of the lower buffer layer 411 and the first polycrystalline semiconductor pattern 414 are formed. The first gate insulating layer 442 may be formed of the single layer or the multi layers made of the inorganic material such as SiOx and SiNx.

Subsequently, the first metal layer is deposited on the first gate insulating layer 442 and then the photolithography process is performed to form the first gate electrode 416, the first electrode 450A of the storage capacitor, and the second light blocking pattern BSM-2. The first metal layer may be formed of the single layer or the multi layers made of the metal such as Cr, Mo, Ta, Cu, Ti, Al, or an Al alloy.

Subsequently, the first interlayer insulating layer 443 is formed. The first interlayer insulating layer 443 may be formed of the single layer or the multi layers made of the inorganic material of SiOx and SiNx.

Subsequently, the second metal layer is formed on the first interlayer insulating layer 443 and then the photolithography process is performed to form the second electrode 450B of the storage capacitor and the first light blocking pattern BSM-1. The second metal layer may be formed of the same metal as the first metal layer.

Subsequently, the second interlayer insulating layer 444 is formed. The second interlayer insulating layer 444 may be formed of the single layer or the multi layers made of the inorganic material such as SiOx and SiNx.

Subsequently, the upper buffer layer 445 is formed as a separation layer that separates the region where the polycrystalline semiconductor pattern and the oxide semiconductor pattern are formed. The upper buffer layer 445 may be formed of the single layer or the multi layers made of the inorganic material of SiO2 or SiNx that does not contain hydrogen particles.

Subsequently, the first oxide semiconductor pattern 474 and the second oxide semiconductor pattern 432 are formed on the upper buffer layer 445.

Subsequently, the second gate insulating layer 446 is formed on the first oxide semiconductor pattern 474 and the second oxide semiconductor pattern 432, and the second gate electrode 478 and the third gate electrode 443 are formed on the second gate insulating layer 446.

Subsequently, the third interlayer insulating layer 447 covering the second gate electrode 478 and the third gate electrode 433 is formed.

Subsequently, the plurality of contact holes CH1 to CH7 are formed.

The process of forming the plurality of contact holes CH1 to CH7 may be divided into the following two steps.

In the first step, the third contact hole CH3, the fourth contact hole CH4, the sixth contact hole CH6, and the seventh contact hole CH7 are formed to expose the second source region 474b and the second drain region 474c of the first oxide semiconductor pattern 474 and the third source region 432b and the third drain region 432c of the second oxide semiconductor pattern 432.

In the second step, the photoresist pattern (not shown in figure) is formed to cover the third contact hole CH3, the fourth contact hole CH4, the sixth contact hole CH6, and the seventh contact hole CH7, and then the first and second contact holes CH1 and CH2 for exposing the first polycrystalline semiconductor pattern 414 and the fifth contact hole CH5 for exposing the first light blocking pattern BSM-1 are formed.

Subsequently, the metal layer for the source electrode and the drain electrode is formed on the third interlayer insulating layer 447 having the first to seventh contact holes CH1 to CH7, and then the first source electrode 417S, the first drain electrode 417D, the second source electrode 479S, the second drain electrode 479D, the third source electrode 434S, and the third drain electrode 434D are formed by the photolithography process using one mask.

Subsequently, the first planarization layer 448 is formed on the first source electrode 417S, the first drain electrode 417D, the second source electrode 479S, the second drain electrode 479D, the third source electrode 434S, and the third drain electrode 434D. thereafter, the eighth contact hole CH8 is formed through the first planarization layer 448 to expose the second drain electrode 479D, and the connection electrode 455 is formed on the first planarization layer 317.

Subsequently, the second planarization layer 449 is formed on the connection electrode 455. The ninth contact hole CH9 is formed through the second planarization layer 449 to expose the connection electrode 455. The first planarization layer 448 and the second planarization layer 449 may be formed of the organic layer such as an acrylic resin or polyimide.

Subsequently, the light emitting device 460 is formed on the second planarization layer 449. The encapsulation layer 470 is formed over the light emitting device 460 to complete the organic light emitting display apparatus. The process of forming the light emitting element device 470 and the encapsulation layer 470 may be the same as a conventional process.

The above description and the accompanying drawings are merely illustrative of the technical spirit of the present disclosure, and those of ordinary skill in the art to which the present disclosure pertains can combine configurations within a range that does not depart from the essential characteristics of the present disclosure, various modifications or variations such as separation, substitution and alteration will be possible. Therefore, the embodiments disclosed in the present disclosure are not intended to limit the technical spirit of the present disclosure, but to explain, and the scope of the technical spirit of the present disclosure is not limited by these embodiments. The protection scope of the present disclosure should be construed by the following claims, and all technical ideas within the scope equivalent thereto should be construed as being included in the scope of the present disclosure.

What is claimed is:

1. An organic light emitting display apparatus comprising:
   a substrate including a first portion and a second portion;
   a first thin film transistor having a first polycrystalline semiconductor pattern, the first thin film transistor on the first portion of the substrate;
   a second thin film transistor having a first oxide semiconductor pattern, the second thin film transistor on the second portion of the substrate; and
   an organic light emitting device configured to emit light, the organic light emitting device connected to the second thin film transistor;
   wherein the first polycrystalline semiconductor pattern includes a surface that is planarized and the first oxide semiconductor pattern includes a surface that includes a plurality of protrusions.

2. The display apparatus of claim 1, wherein the substrate includes a display area and a non-display area that is outside the display area, and the first portion is in at least one of the display area and the non-display area, and the second portion is at the display area.

3. The display apparatus of claim 2, further comprising:
   a third transistor including a second oxide semiconductor pattern in the display area,
   wherein the second thin film transistor is a driving thin film transistor that is configured to drive a pixel that includes the organic light emitting device, and the third thin film transistor is a first switching thin film transistor that is configured to apply a data signal to the second thin film transistor.

4. The display apparatus of claim 3, further comprising:
a fourth thin film transistor disposed in the display area, wherein the fourth thin film transistor is a second switching thin film transistor.

5. The display apparatus of claim 3, wherein the first thin film transistor includes:
the first polycrystalline semiconductor pattern on the substrate, the first polycrystalline semiconductor pattern having a first channel region, a first source region at a first side of the first channel region, and a first drain region at a second side of the first channel region that is opposite the first side of the first channel region;
a first gate electrode overlapped with the first channel region; and
a first source electrode and a first drain electrode respectively connected to the first source region and the first drain region, the first source electrode and the first drain electrode over the first polycrystalline semiconductor pattern, and
wherein the second thin film transistor includes:
the first oxide semiconductor pattern on the substrate and on a different layer than the first polycrystalline pattern, the first oxide semiconductor pattern having a second channel region, a second source region at a first side of the second channel region, and a second drain region a second side of the second channel region that is opposite the first side of the second channel region;
a second gate electrode overlapped with the second channel region;
a second source electrode and a second drain electrode respectively connected to the second source region and the second drain region of the first oxide semiconductor pattern, the second source electrode and the second drain electrode over the first oxide semiconductor pattern; and
a first light blocking pattern overlapped with the first oxide semiconductor pattern, the first light blocking pattern closer to the substrate than the first oxide semiconductor pattern.

6. The display apparatus of claim 5, wherein the second thin film transistor is disposed in a sub-pixel of the second portion and the sub-pixel includes a storage capacitor having a first storage capacitor electrode that is on a same layer as the first gate electrode and a second storage capacitor electrode on a same layer as the first light blocking pattern.

7. The display apparatus of claim 5, wherein the first light blocking pattern and an insulating layer between the substrate and the first light blocking pattern each includes a plurality of protrusions that overlap the plurality of protrusions of the first oxide semiconductor pattern.

8. The display apparatus of claim 5, wherein the third thin film transistor includes:
a second oxide semiconductor pattern having a third channel region, a third source region at a first side of the third channel region, and a third drain region at a second side of the third channel region that is opposite the first side of the third channel region;
a third gate electrode overlapped with the third channel region;
a third source electrode and a third drain electrode respectively connected to the third source region and the third drain region; and a second light blocking pattern overlapped with the second oxide semiconductor pattern, the second light blocking pattern closer to the substrate than the second oxide semiconductor pattern.

9. The display apparatus of claim 8, wherein the second light blocking pattern is on a same layer as the first gate electrode.

10. The display apparatus of claim 5, wherein the first light blocking pattern is electrically connected to the second source electrode or the second drain electrode.

11. The display apparatus of claim 1, wherein the substrate includes a display area and a non-display area outside the display area, and the first portion is at the non-display area but not the display area, and the second portion is at the display area.

12. A method of fabricating an organic light emitting display apparatus, the method comprising:
providing a substrate including a first portion and a second portion that is spaced apart from the first portion;
forming a lower buffer layer on the substrate;
forming a polycrystalline semiconductor layer on the lower buffer layer;
planarizing an upper surface of a first portion of the polycrystalline semiconductor layer that is on the first portion without planarizing an upper surface of a second portion of the polycrystalline semiconductor layer that is on the second portion of the substrate;
forming a first polycrystalline semiconductor pattern in the first portion and a first plurality of protrusions at the upper surface of the lower buffer layer in the second portion by etching the polycrystalline semiconductor layer; and
forming a first oxide semiconductor pattern over the first plurality of protrusions, the first oxide semiconductor pattern including a second plurality of protrusions that overlap the first plurality of protrusions.

13. The method of claim 12, wherein planarizing the upper surface of the first portion of the polycrystalline semiconductor layer comprises:
forming a first etching protection layer on the polycrystalline semiconductor layer on the second portion; and
wet etching the upper surface of the first portion of the polycrystalline semiconductor layer to planarize the upper surface of the first portion of the polycrystalline semiconductor layer, wherein the upper surface of the second portion of polycrystalline semiconductor layer is not planarized due to the first etching protection layer.

14. The method of claim 13, wherein the upper surface of the first portion of the polycrystalline semiconductor layer is etched by a wet etching solution containing a sulfur hexafluoride (SF6) and a chlorine (Cl2).

15. The method of claim 12, wherein forming the first polycrystalline semiconductor pattern in the first portion and the first plurality of protrusions at the upper surface of the lower buffer layer in the second portion by etching the polycrystalline semiconductor layer comprises:
forming a second etching protection layer over the planarized polycrystalline semiconductor layer in the first portion of the substrate, the second etching protection layer defining the first polycrystalline semiconductor pattern; and
dry etching the polycrystalline semiconductor layer until the lower buffer layer is exposed.

16. The method of claim 12, further comprising:
forming a first gate insulating layer on the first polycrystalline semiconductor pattern;
forming a first gate electrode overlapped with first polycrystalline semiconductor pattern and a first storage capacitor electrode on the first gate insulating layer;
forming a first interlayer insulating layer on the first gate electrode;
forming a second storage capacitor electrode and a first light blocking pattern on the first interlayer insulating layer, the second storage capacitor electrode overlapping with the first storage capacitor electrode and the first light blocking pattern overlapping with the first plurality of protrusions first;
forming an upper buffer layer on the first light blocking pattern;
forming the first oxide semiconductor pattern on the upper buffer layer;
forming a second gate insulating layer on the first oxide semiconductor pattern;
forming a second gate electrode on the first oxide semiconductor pattern, the second gate electrode being overlapped with first oxide semiconductor pattern with the second gate insulating layer interposed therebetween; and
forming a first source electrode, a first drain electrode, a second source electrode, and a second drain electrode over the second gate electrode with a third interlayer insulating layer interposed therebetween, the first source electrode and the first drain electrode connected to the first polycrystalline semiconductor pattern, the second source electrode and the second drain electrode connected to the first oxide semiconductor pattern.

17. The method of claim 16, further comprising forming a third thin film transistor by:
forming a second light blocking pattern on the first interlayer insulating layer;
forming a second oxide semiconductor pattern on the upper buffer layer; and
forming a third source electrode and a third drain electrode that are connected to the second oxide semiconductor pattern,
wherein the second light blocking pattern is disposed on a same layer as the first gate electrode, the second light blocking pattern overlapping the second oxide semiconductor pattern, and the second light blocking pattern is closer to the substrate than the first light blocking pattern.

18. The method of claim 12, wherein the substrate includes a display area and a non-display area outside the display area, and the second portion is at the display area and the first portion is at least one area of the display area and the non-display area.

19. The method of claim 12, wherein the first oxide semiconductor pattern is a part of a driving thin film transistor for driving a sub-pixel.

20. A display device comprising:
a substrate including a display area and a non-display area;
a first transistor in the display area, the first transistor including a first semiconductor layer with a first plurality of protrusions on at least a portion of a surface of the first semiconductor layer;
a second transistor in the non-display area, the second transistor including a second semiconductor layer that is made of a different material than the first semiconductor layer and a surface of the second semiconductor layer is planarized; and
a light emitting device in the display area, the light emitting device electrically connected to the first transistor.

21. The display device of claim 20, wherein the first semiconductor layer includes an oxide semiconductor and the second semiconductor layer includes a polycrystalline semiconductor.

22. The display device of claim 21, wherein the second semiconductor layer is closer to the substrate than the first semiconductor layer.

23. The display device of claim 20, further comprising:
a third transistor in the display area, the third transistor including a third semiconductor layer made of a same material as the first semiconductor layer,
wherein a surface of the third semiconductor layer lacks a plurality of protrusions.

24. The display device of claim 23, further comprising:
a first light blocking layer overlapping with the first semiconductor layer, the first light blocking layer having a surface including a second plurality of protrusions that overlaps the first plurality of protrusions; and
a second light blocking layer overlapping with the third semiconductor layer, the second light blocking layer closer to the substrate than the first light blocking layer.

25. The display device of claim 24, further comprising:
a capacitor that is electrically connected to at least one of the first semiconductor layer and the first light blocking layer.

26. The display device of claim 25, wherein the capacitor includes a first electrode and a second electrode, the first electrode made of a same material as the first light blocking layer and the second electrode made of a same material as the second light blocking layer.

27. The display device of claim 24, further comprising:
an insulating layer between the first light blocking layer and the substrate, the insulating layer including a third plurality of protrusions that overlaps the first plurality of protrusions and the second plurality of protrusions.

* * * * *